United States Patent [19]

Yamamoto et al.

[11] Patent Number: 5,158,708
[45] Date of Patent: * Oct. 27, 1992

[54] CONDUCTIVE PASTE AND CONDUCTIVE COATING FILM

[75] Inventors: Yuzo Yamamoto, Wakayama; Tomoyuki Haishi, Kyoto; Hiromitsu Hayashi, Wakayama; Masaki Iwasaki, Wakayama; Yumi Rakue, Wakayama, all of Japan

[73] Assignee: Kao Corporation, Tokyo, Japan

[*] Notice: The portion of the term of this patent subsequent to Oct. 20, 2009 has been disclaimed.

[21] Appl. No.: 618,973

[22] Filed: Nov. 28, 1990

[30] Foreign Application Priority Data

Dec. 1, 1989 [JP] Japan .................. 1-312978

[51] Int. Cl.$^5$ ............ H01B 1/20; H01B 1/22
[52] U.S. Cl. ........................ 252/512; 523/457; 523/458; 523/459; 524/439
[58] Field of Search ............ 252/512, 513, 514, 500; 524/439; 523/457–459

[56] References Cited

FOREIGN PATENT DOCUMENTS

| | | |
|---|---|---|
| 55-029276 | 3/1980 | Japan . |
| 60-260663 | 12/1985 | Japan . |
| 61-72045 | 4/1986 | Japan . |
| 61-237435 | 10/1986 | Japan . |
| 62-013473 | 1/1987 | Japan . |
| 62-032158 | 2/1987 | Japan . |
| 62-061336 | 3/1987 | Japan . |
| 62-218413 | 9/1987 | Japan . |
| 62-253675 | 11/1987 | Japan . |
| 63-015497 | 1/1988 | Japan . |
| 63-083178 | 4/1988 | Japan . |
| 63-312997 | 12/1988 | Japan . |
| 1-029467 | 1/1989 | Japan . |

Primary Examiner—Mark L. Bell
Assistant Examiner—Anthony J. Green
Attorney, Agent, or Firm—Birch, Stewart, Kolasch & Birch

[57] ABSTRACT

An electrically conductive paste composition comprises an electric conductive powder, an organic binder comprising (A) a polyhydroxystyrene derivative and (B) a thermosetting resin at a weight ratio of (A) to (B) in the range between 5/95 and 95/5 and a solvent. The paste is used for an electric circuit printed on a substrate and improved in view of migration resistance, flexibility and reliability.

18 Claims, 1 Drawing Sheet

Copper Content Based On The
Cured Coating Film (wt. %)

CONDUCTIVE PASTE AND CONDUCTIVE COATING FILM

FIELD OF THE INVENTION

The present invention relates to a conductive paste containing a conductive powder material and an organic binder and a conductive coating film made from the paste. Particularly, the present invention relates to a conductive paste which provides a conductive coating film which is excellent in migration resistance, flexibility and reliability by applying it on a circuit board such as a paper/phenolic resin or glass/epoxy resin board by, e.g., screen process printing and curing it under heating; and therefor it is useful as a conductor for suppressing the electromagnetic interference of a circuit board or for wiring of a circuit board, the present invention is also directed to a conductive coating film prepared by applying the paste by coating or printing and curing it.

DESCRIPTION OF RELATED ART

Generally, a conductive paste is essentially composed of an organic binder (hereinafter sometimes abbreviated to "binder") such as an epoxy, saturated polyester, acrylic or phenolic resin, a conductive powder material and a solvent.

Up to this time, such a conductive paste has been used as a conductor for a circuit board. Further, an attempt to use such a paste as an electromagnetic shielding material for a printed circuit board has recently been made. According to this attempt, in a printed circuit board prepared by forming a conductive layer on a substrate in a circuit pattern containing an earth pattern, an insulating layer is formed by printing so as to cover the conductive layer excepting the earth pattern and a conductive paste is further applied thereto by printing so as to cover the insulating layer and to be connected to the earth pattern. Thereby, an electromagnetic shielding layer is formed. Thus, a conductive paste is also used as a conductor of a circuit board for suppressing electromagnetic interference (see Japanese Patent Laid-Open No. 15497/1988 and Japanese Utility Model Laid-Open No. 29276/1980).

Among the conductive pastes, a copper paste is noted as a new conductor replacing a silver paste, because a copper paste is more inexpensive than a silver paste and is superior to the latter in the resistance to migration, i.e. a phenomenon in which copper ionizes when a voltage is applied to a circuit in the presence of water and the formed ions are reduced to form a precipitate which grows in the dendritic form to short out the circuit. However, a current copper paste is still problematic in that its migration resistance is quite unsatisfactory to be used as a conductor of a circuit board for suppressing electromagnetic interference (EMI), because the paste to be used as such a conductor is required to have extremely high migration resistance. Since migration is causative of a serious accident accompanying the malfunction of a circuit, this problem sets up the most significant barrier against the spread of a circuit board for suppressing EMI. Although the electromagnetic interference of a circuit board is now suppressed by suitably modifying an epoxy insulating interlayer or an overcoat layer to thereby fill immediate needs, it has been expected to solve the problem substantially by modifying a copper paste itself. Further, a copper paste has a defect that the cured coating film made therefrom is generally so poor in flexibility as to be easily damaged by, for example, mechanical shock given in the mounting of the components, though the adhesion of the film is good in a way.

Although little studies have been made on the above problem and, for example, a process comprising adding a small amount of zinc to metallic copper has been proposed to improve the migration resistance (see Japanese Patent Laid-Open No. 312997/1988), the problem remains unsolved as yet.

On the other hand, although only a few attempts to directly improve the flexibility of a copper paste coating film have been made, many improvements of the binder in consideration of the adhesion having a close relation with the flexibility are found. For example, there have been made an attempt to improve the adhesion of a copper paste coating film to a metal or an insulating layer by using a resin, polyol and a polyester and/or alkyd resin (see Japanese Patent Laid-Open No. 253675/1987), one to improve the adhesion of a copper paste coating film to a metal by using a mixture comprising a melamine resin and an acrylic resin (see Japanese Patent Laid-Open No. 83178/1988), one to facilitate the peeling with a solvent by using a poly-p-hydroxystyrene (see Japanese Patent Laid-Open No. 260663/1985) and one to use an epoxy-modified poly-p-hydroxystyrene resin (see Japanese Patent Laid-Open No. 29467/1989). However, none of these attempts can satisfy the above requirement sufficiently.

SUMMARY OF THE INVENTION

Under these circumstances, the inventors of the present invention have intensively studied to improve the migration resistance and flexibility of a conductive paste and have found that a paste prepared by using a specified polyhydroxystyrene derivative and a thermosetting resin as binder components and adding a specific amount of a conductive powder material can lower the electrochemical activity of a metal surface and give a coating film having a reduced residual internal stress, thus attaining the above object. The present invention has been accomplished on the basis of this finding.

Namely, the present invention relates to an electrically conductive paste comprising a conductive powder material, an organic binder and a solvent as essential components, characterized in that said organic binder comprises a polyhydroxystyrene derivative represented by the following general formula (I) and a thermosetting resin and that the amount of the conductive powder material is 50% by weight or above but below 90% by weight based on the total paste constituents excluding the solvent, and a conductive coating film prepared by applying said paste to a substrate by coating or printing and curing it:

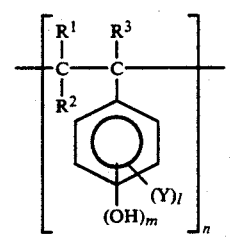

(I)

(wherein n is such an arbitrary number of at least 3 as to give an organic polymer having a number-average molecular weight of up to 10,000; m is a number satisfying the relationship: $0 < m \leq 2$, l is a number satisfying the relationship: $0 \leq l \leq 2$; Y is a halogen atom, and $R^1$ to $R^3$ are each a halogen atom or an alkyl group having 1 to 5 carbon atoms).

According to the present invention, the maximum synergistic effect between the polyhydroxystyrene derivative and the thermosetting resin can be exhibited by selecting the kinds and proportions of them, and the activity of a metal face and the shrinkage stress and residual internal stress of the coating film can be controlled for the first time by using the both. By virtue of these effects, the migration resistance and flexibility of a copper paste coating film can be improved and high conductivity can be exhibited even when a conductive powder material with a relatively low density is used.

The polyhydroxystyrene derivative to be used in the present invention as a binder component is represented by the above general formula (I), wherein each of m, n and l is not an integer but an arbitrary number (a real number) falling within a specific range. From the standpoint of the monomers constituting a polymer, each of m, n and l must be, of course, an integer. However, since a polymer is a mixture in its nature, the properties of a polymer deemed as a mixture are more reasonable than those thereof based on the proportion of each individual polymer. Accordingly, in the above general formula (I), m, n and l are each defined as an average value.

Examples of the polyhydroxystyrene derivative represented by the general formula (I) include homopolymers of hydroxystyrene or its derivative such as isopropenylphenol (hydroxy-α-methylstyrene) or hydroxy-α-ethylstyrene. Although the hydroxystyrene and isopropenylphenol may be each any one of ortho, meta and para isomers or a mixture thereof, para and meta isomers are preferable.

The polyhydroxystyrene derivative represented by the above general formula (I) to be used as an organic binder component according to the present invention desirably has a number-average molecular weight ($\overline{Mn}$) of 500 or above but below 10,000, more desirably 1,000 to 9,000, most desirably 1,000 to 6,000. This is because the molecular weight of the derivative has a great influence on some of the effects of the present invention. Namely, in the cured coating film according to the present invention, the polyhydroxystyrene derivative acts as a soft segment for relaxing the residual internal stress and forms a dense insulating film on the surface of a metal powder. If the $\overline{Mn}$ is less than 500, the resulting coating film will hardly be improved in migration resistance and flexibility. The effect of improving the migration resistance exhibits a protruding peak in the $\overline{Mn}$ range of 500 to 10,000. On the contrary, if the $\overline{Mn}$ exceeds 10,000, the migration resistance will be extremely low and the resulting derivative will be problematically poor in the solubility in a solvent such as butyl carbitol and in the compatibility with the thermosetting resin to be blended therewith.

As described above, the conductive paste is an extremely delicate composition and the function mechanism thereof is little apparent as yet. The inventors of the present invention have extensively studied to find out that one of the factors affecting the function of the polyhydroxystyrene derivative resides in the backbone chain structure thereof. That is, when the polyhydroxystyrene derivative has a number-average molecular weight less than 10,000, the backbone chain of the derivative is straight. On the contrary, when the derivative has a number-average molecular weight exceeding 10,000, the derivative contains a branched backbone chain in an amount increased as the molecular weight becomes higher, which is estimated to be causative of lowering in the adsorption of the derivative on a metal and the denseness of a protective film to thereby exert an adverse effect on the migration resistance.

Since most of the polyhydroxystyrene derivatives are thermoplastic resins, it is preferable to use a thermosetting resin simultaneously.

The thermosetting resin to be effectively used in the present invention includes various known ones such as phenolic, urea, amino, alkyd, silicone, furan, unsaturated polyester, epoxy, polyurethane, polyester polyol and acrylic resins, among which phenolic and amino resins are particularly preferable.

The phenolic resin includes resins prepared by the addition and condensation of a phenolic hydroxyl-containing compound with an aldehyde such as formalin or furfural, wherein the phenolic hydroxyl-containing compound includes phenol, cresol, xylenol, p-alkylphenol, chlorophenol, bisphenol A, phenolsulfonic acid and resorcinol. Particularly, phenolic resins of resol type are preferred. When a phenolic resin of novolak type is used, it is preferable to use hexamethylenetetramine simultaneously.

The amino resin is preferably one having a weight-average molecular weight of 500 to 50,000. Examples thereof include resins prepared by the addition and condensation of formalin to the amino groups of urea, melamine, guanamine, aniline or sulfonamide; epoxy-modified melamine resins, phenol-modified melamine resins, acrylic-modified melamine resins, butylated urea resins, butylated urea-melamine cocondensation resins, butylated melamine-guanamine cocondensation resins, amino-alkyd co-condensation resins and alkyl-etherified melamine resins, among which alkyl-etherified melamine resins are preferable.

The alkyl-etherified melamine resin includes methylated melamine resins such as Super-Beckamine L-105-60; n-butylated melamine resins such as Super-Beckamine J-820-60, J-840, L-117-60, L-127-60 and L-109-50 and iso-butylated melamine resins such as Super-Beckamine G-821-60, L-118-60, L-121-60, TD-139-60, L-110-60, L-125-60, 47-508-60, L-145-60 and L-116-70 (products of Dainippon Ink & Chemicals, Inc., trade names); and n-butylated melamine resins such as Yuban 20SB, 20SE-60, 20HS, 21R, 22R, 120, 122, 128, 220 and 225 and iso-butylated melamine resins such as Yuban 60R, 62, 69-1, 164 and 165 (products of Mitsui Toatsu Chemicals, Inc., trade names). Among these alkyl-etherified melamine resins, it is desirable to use one having a weight-average molecular weight ($\overline{Mw}$) ranging from 500 to 50,000 and a degree of etherification ranging from 10 to 95% (100% means a state wherein six alkyl ether groups are introduced into one triazine unit), more desirably one having a $\overline{Mw}$ ranging from 1,000 to 25,000 and a degree of etherification of 20 to 80%, most desirably one having a $\overline{Mw}$ ranging from 1,000 to 10,000 and a degree of etherification of 30 to 60%. If the $\overline{Mw}$ is less than 500, the resulting cured coating film will be poor in flexibility, while if it exceeds 50,000, the resulting film will be poor in migration resistance and electric conductivity. Further, if the degree of etherification is less than 10%, the resulting melamine will be unstable to give a conductive paste having a shortened potlife, while if it exceeds 95%, the curing rate of the paste will be too low to form a sufficiently dense coating film under conventional curing conditions, so that the film will be insufficient in migration resistance and electric conductivity.

The epoxy-modified melamine resin includes Yuban 80S. The acrylic-modified melamine resin includes Dianal HR series (products of Mitsubishi Rayon Co., Ltd.). The butylated urea resin includes Yuban 105-60 and 10R. The butylated urea/melamine co-condensation resin includes Yuban 134, 135 and 136 and Beckamine OD-L-131-60 and L-806-60. The amino-alkyd co-condensation resin includes Beckosol M-7600, M-7600-M, 47-623, M-7606-55-MV, M-7606-55-HV, M-7608-55, M-7611-55, M-7615-60, M-7630-80, M-7631-80 and M-7652-55 (products of Dainippon Ink & Chemicals, Inc.).

The use of a known acid or alkali catalyst in the curing reaction between an amino resin as described above and the polyhydroxystyrene derivative is extremely effective in giving a conductive coating film excellent in endurance and adhesion. Particularly, it is preferable to use an acid catalyst which may be any known acid, for example, a mineral acid such as hydrochloric or phosphoric acid, an organic fatty acid such as linoleic or oleic acid or an organic acid such as oxalic, tartaric or p-toluene-sulfonic acid.

The epoxy resin to be used as the thermosetting resin according to the present invention is preferably bisphenol diepoxide and examples thereof include Epikote 827, 828, 834, 1001, 1002, 1004, 1007 and 1009 (products of Shell Chemical); DER 330, 331, 332, 334, 335, 336, 337, 660, 661, 662, 667, 668 and 669 (products of Dow Chemical); Araldite GY 250, 260, 280, 6071, 6084, 6097 and 6099 (products of Ciba-Geigy); EPI-RE 2510 and 5101 (products of Jones Dabney); Epiclon 810, 1000, 1010 and 3010 (products of Dainippon Ink & Chemicals, Inc.) (trade names) and EP series (products of Asahi Denka Kogyo K.K.). Further, an epoxy resin having at least three epoxy groups on an average, such as an epoxy novolak resin may be also used in the present invention. It is preferable that the epoxy novolak resin have a molecular weight of 500 or above. Examples of an epoxy novolak resin which is industrially produced include Araldite EPN 1138 and 1139 and ECN 1273, 1280 and 1299 (products of Ciba-Geigy); DEN 431 and 438 (products of Dow Chemical); Epikote 152 and 154 (products of Shell Chemical); ERR-0100, ERRB-0447 and ERLB-0488 (products of Union Carbide); and EOCN series (products of Nippon Kayaku). If necessary, a curing catalyst for an epoxy resin or a diluent may be used. For example, a diethylene/diluent can be used as such a curing catalyst.

According to the present invention, the thermosetting resins described above may be used alone or as a mixture of two or more of them.

The content of the binder in the conductive paste is 5 to 50% by weight, preferably 5 to 40% by weight, based on the total paste constituents excluding the solvent. If the content is less than 5% by weight, the resulting paste will be lowered in adhesion and fluidity to give poor printability and the conductive powder material will be liable to be oxidized during thermal curing to lower the flexibility and electric conductivity. On the contrary, if it exceeds 50% by weight, electric conductivity necessary for forming a circuit will not be attained owing to the deficiency in the absolute quantity of the conductive powder material.

The weight ratio of the polyhydroxystyrene derivative (A) to the thermosetting resin (B) ranges suitably from 5 : 95 to 95 : 5, preferably from 10:90 to 70:30.

The conductive powder material to be used in the present invention include powders of metals such as copper, silver, nickel and aluminum; and powders covered with these metals, among which copper powder is particularly preferable. Although the shape of the conductive powder material may be any of dendrite, flake, sphere and an irregular one, dendritic and spherical powders of electrolytic copper are preferable. The mean particle diameter of the powder material is preferably 30 $\mu$m or below. Particularly, a dendrite having a mean particle diameter of 1 to 10 m is still preferable in respect of the easiness of high-density, multi-contact packing. The term "mean particle diameter" used in this specification refers to a volume base median diameter as determined with an LA-500, an apparatus for particle size distribution measurement of laser diffraction type mfd by Horiba, Ltd. If the mean particle diameter exceeds 30 $\mu$m, the high-density packing of the conductive powder material will be difficult to damage the electrical conductivity and printability of the paste. When a surface-treated copper powder is used, a coating film particularly excellent in electric conductivity, migration resistance and flexibility can be easily obtained. The surface treatment may be an organic one, because neither the copper paste nor the film thereof according to the present invention need come to contact with solder. The conductive powder materials may be used either alone or as a mixture of two or more of them. Particularly, when a copper powder is used, it is the most desirable that the purity of the copper powder be equal to that of the copper foil or copper deposit used as a conductor of a circuit board.

When a metallic copper powder is used, the effect of the polyhydroxystyrene derivative according to the present invention can be exhibited more remarkably, so that the present invention is particularly useful for the preparation of a conductive copper paste.

The content of the conductive powder material in the paste of the present invention is preferably 50% by weight or above but below 90% by weight, still preferably 60 to 87.5% by weight and particularly preferably 75 to 85% by weight based on the total paste constituents excluding the solvent. If the content is less than 50% by weight, no sufficiently high electric conductivity will be attained, while if it is 90% by weight or above, the conductive powder material will not sufficiently be bound to give a brittle coating film poor in flexibility and migration resistance and the resulting paste itself will be poor in screen process printability.

FIG. 1 shows a relationship between the copper powder content in the cured coating film and the specific resistance thereof. As shown in FIG. 1, in a copper powder content range of 50 to 90% by weight, the specific resistance remarkably drops to give good conductivity.

The conductive paste of the present invention may contain one or more additives selected from among saturated and unsaturated fatty acids, metal salts thereof and higher aliphatic amines for the purpose of improving the oxidation resistance and dispersibility of the powder material or accelerating the curing. Preferable examples of the saturated fatty acid include palmitic, stearic and arachic acids, while those of the unsaturated fatty acid include oleic and linoleic acids. The metal salts thereof include sodium and potassium salts thereof. Further, it is possible to use a vegetable oil containing at least 60% of an unsaturated fatty acid, for example, soybean, sesame, olive or safflower oil.

Further, a conductive coating film which is particularly excellent in electric conductivity, migration resistance and corrosion resistance (reliability against humidity) can be obtained by using an alkyl or alkenyl derivative of phenol represented by the following formula (II) such as linoleic or ricinoleic derivative of phenol:

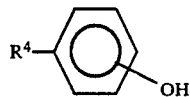
(II)

wherein $R^4$ is bonded to an ortho or para position and is a residue of an unsaturated fatty acid or ester thereof represented by the following formula (III):

(III)

(wherein $R_5$ represents an alkyl or alkenyl group having 15 to 21 carbon atoms and $R_6$ represents a hydrogen atom, a hydroxyalkyl group having at least one carbon atom, a branched or straight-chain alkyl group or an aryl group).

Examples of the unsaturated fatty acid represented by the formula (III) include palmitoleic, oleic, elaidic, linoleic, linolenic, vaccenic, arachidonic, α-eleostearic, tariric, ricinoleic and erucic acids.

The unsaturated fatty acid ester includes mono, di and tri-esters prepared by the esterification of the unsaturated fatty acids listed above with various alcohols. The alcohol to be used in the esterification includes straight-chain and branched monohydric alcohols such as methanol, ethanol, propanol, octyl alcohol, dodecyl alcohol, stearyl alcohol, oleyl alcohol and isostearyl alcohol; polyhydric alcohols such as ethylene glycol, propylene glycol, butanediol, hexanediol, nonanediol, propylene glycol, glycerol and sorbitol and aromatic mono and dihydric alcohols such as benzyl alcohol, phenol, octylphenol, nonylphenol and catechol.

The amount of the saturated or unsaturated fatty acid or metal salt thereof to be added is preferably 0.1 to 20 parts by weight, still preferably 0.5 to 10 parts by weight per 100 parts by weight of the conductive powder material used. If the amount is less than 0.1 part by weight, the addition will hardly give any effect, while if it exceeds 20 parts by weight, not only the dispersibility of the powder material will not be improved for the amount, but also the electric conductivity and endurance of the coating film will be lowered.

The higher aliphatic amine to be used in the present invention may be any amino-containing organic compound, which may have other substituent(s). For example, it may be a hydroxyl-containing amine derived from an α-olefin. However, since the amine is used together with the conductive powder material, it is impossible to use a solid amine insoluble in a solvent. Higher aliphatic amines having 8 to 22 carbon atoms are preferably used. Examples of such an amine include saturated monoamines such as stearylamine, palmitylamine, behenylamine, cetylamine, octylamine, decylamine and laurylamine; unsaturated monoamines such as oleylamine; and diamines such as stearylpropylenediamine and oleylpropylenediamine.

According to the present invention, it is preferable to use a higher aliphatic amine in a total amount of 0.1 to 10 parts by weight per 100 parts by weight of the conductive powder material used.

If necessary, one or more known reducing agents may be added to the conductive paste of the present invention in order to prevent the oxidation of the powder material. Preferable examples of the reducing agent include inorganic reducing agents such as phosphorous and hypophosphorous acids; and organic and inorganic compounds such as hydroquinone, catechol, ascorbic acid, hydrazine, formalin, borohydride and reducing sugar.

When a reducing agent is used in the present invention, the amount thereof is generally 0.1 to 20 parts by weight, preferably 0.5 to 10 parts by weight per 100 parts by weight of the conductive powder material used.

The conductive paste of the present invention can be prepared by, for example, dissolving the polyhydroxystyrene derivative in a solvent to give a solution, adding a thermosetting resin and a conductive powder material to the solution to give a mixture and sufficiently and homogeneously kneading the mixture with a dispersion mixer, ball mill or triple roll mill.

Examples of the solvent to be used in the preparation of the paste include benzene, toluene, hexanone, butyl carbitol, butyl carbitol acetate, butyl cellosolve, butyl cellosolve acetate, methyl isobutyl ketone, methyl amyl ketone; ethylene and propylene glycol ethers such as propylene glycol monomethyl ether acetate and ethyl ethoxypropionate; diesters of dibasic acids such as dimethyl adipate, dimethyl glutarate and dimethyl succinate; and other known solvents.

The amount of the solvent used varies depending upon the kind of the kneading machine used, the kneading conditions employed and the kind of the solvent used. It is preferable to control the amount of the solvent so as to give a paste having a viscosity suitable for screen process printing after kneading.

A circuit board for suppressing electromagnetic interference which is provided with an electromagnetic shielding layer made from the conductive paste of the present invention can be prepared by, for example, applying a heat-curing or UV-curing organic insulator to a conductive circuit made from a metal-clad laminate by the etched foil method exclusive of the earth pattern area to form an insulating layer, and applying the conductive paste of the present invention to nearly the whole surface of the insulating layer by screen process printing so as to be connected to the earth pattern and cured by heating. Thus, a circuit board for suppressing electromagnetic interference provided with an effective electromagnetic shielding layer can be obtained. This circuit boards is also useful as an electrostatic shielding layer.

Further, when the conductive paste of the present invention is used as a conductor for wiring of a circuit board, a conventional method may be employed. The insulate substrate to be coated with the paste includes those made of glass/epoxy, paper/phenolic resin, ceramic, polycarbonate resin, polyethylene terephthalate resin, polyimide resin, polyolefin resin, vinyl chloride resin, polyester resin, ABS resin, polymethyl methacrylate resin, melamine resin, phenolic resin, epoxy resin and glass. A circuit can be formed by screen process printing, letterpress printing, spraying, brushing or the like.

The term "conductive coating film" as used in this specification means a cured body or cured coating film prepared by drying and curing the conductive paste of the present invention and having a volume resistivity of $1 \times 10 - 2^2$ Ω.cm or below.

As described above, the conductive paste of the present invention is characterized by containing a polyhydroxystyrene derivative having a specific chemical structure and a thermosetting resin as binder components. According to the present invention, the migration resistance and flexibility of a conductive coating film can be remarkably improved by selecting the molecular weight of the polyhydroxystyrene derivative, the molecular weight of the thermosetting resin, the kind and content of the substituent to be introduced, the proportions of the constituents and the shape and amount of the conductive powder material.

Accordingly, the problematic migration resistance and flexibility of the coating film made from the copper paste of the prior art can be remarkably improved by using the conductive copper paste of the present invention. Further, by using this new copper paste, a highly reliable and effective electromagnetic shielding layer can be easily and stably formed on a circuit board. Furthermore, when the copper paste is used as a conductor for wiring of a circuit board, a highly reliable wiring can be formed. The paste can be also effectively used as an electrode of an electronic appliance or a circuit component. These effects are remarkably significant from the industrial viewpoint.

The polyhydroxystyrene derivative of the invention can be used as a surface-treating agent for the electrically conductive powder.

EXAMPLE

Figure 1:
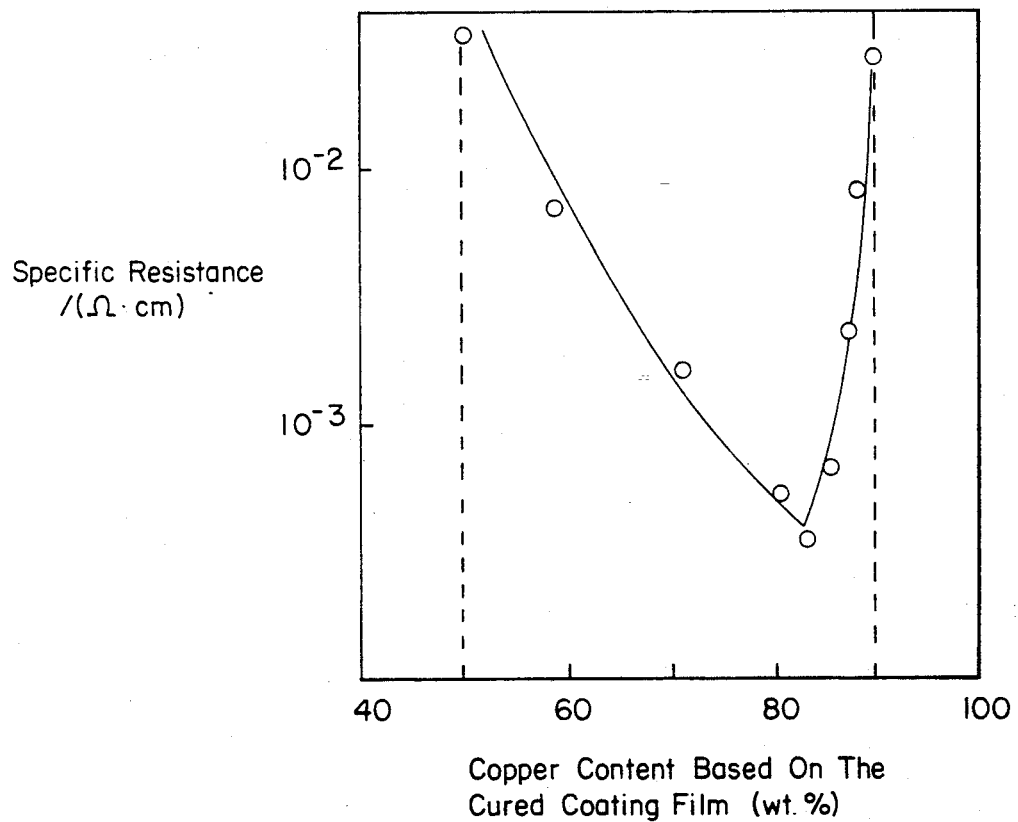
FIG. 1 is a graph showing a relationship between the content of copper powder in a cured coating film and the resistivity of the film.

The present invention will now be described in more detail by referring to the following Examples and Comparative Examples, though the present invention is not limited to them. In the following Examples and Comparative Examples, all parts are by weight.

EXAMPLE

Preparation of Paste and Printing Thereof

Conductive powder materials listed in Table 1, polyhydroxystyrene derivatives listed in Table 2 and thermosetting resins and additives listed in Table 3 were combined so as to give formulations specified in Table 4. The mixtures thus prepared were each sufficiently kneaded with a dispersion mixer or a triple roll mill to give homogeneous conductive pastes. A straight line having a width of 1 mm and a length of 7 cm was printed on a glass/epoxy resin substrate (CEM-3 substrate) in each of the pastes by the use of a screen printing machine fitted with a Tetoron screen of 180 to 250 mesh, followed by thermal curing at 140° to 160° C. for 10 to 30 minutes. Thus, a cured film having a thickness of 20 to 30 μm was formed.

The conductive circuit thus formed was examined for various characteristics according to the following methods, and the results are given in Table 4:

Determination of Electric Conductivity

The term "electric conductivity of coating film" refers to a volume resistivity of a thermally cured coating film as determined by the two-terminal method with a digital multimeter (mfd. by Advantest Corp.; R 6551).

The volume resistivity is calculated according to the following equation (1):

$$\text{volume resistivity } (\Omega \cdot cm) = \frac{R \times t \times W}{L}$$

R: resistance between electrodes (Ω)
t: thickness of coating film (cm)
W: width of coating film (cm)
L: distance between electrodes (cm)

Migration Resistance

Two lines were printed on a glass/epoxy substrate in each of the copper paste in counter parallel with each other so as to give an electrode gap of 1.0 mm. A d.c. voltage of 20 V was applied between the electrodes at 60° C. and a relative humidity of 95% to determine the short circuit current. The migration resistance of a conductive film was evaluated by comparing the time T which has elapsed until the short circuit current of the film rapidly increases with the time $T_0$ with respect to comparative film No. 46 according to the following criteria:

A: $T/T_0 > 2$
B: $1.5 < T/T_0 \leq 2$
C: $1 < T/T_0 \leq 1.5$
D: $T/T0 \leq 1$

Flexibility

A copper paste was applied to a CEM-3 substrate ($1 \times 15$ cm) to form a cured coating film having a thickness of 25 μm. The resulting coated substrate was repeatedly deflected by 10 mm five times by applying a load to the center of the substrate and examined for electric conductivity and adhesion (vertical tensile test). The obtained results were evaluated according to the following criteria:

⊚: neither electric conductivity nor adhesion changed
○: the rate of change in the electric conductivity or the adhesion is less than 10%
Δ: the rate of change in the electric conductivity or the adhesion is 10% or above but less than 30%
x: the rate of change in the electric conductivity or the adhesion is 30% or above

Evaluation of Printability

The printability of each conductive paste was determined in the screen process printing with a Tetoron screen of 180 to 125 mesh and evaluated according to the following criteria:

○: well printable
Δ: printable in a way
x: unprintable

COMPARATIVE EXAMPLE

Conductive pastes each having a formulation specified in Table 4 were prepared. In a similar manner to that of the Examples, each of the pastes was applied to a substrate to form a conductive film, which was examined for volume resistivity, migration resistance, flexibility and printability. The results are given in Table 4.

TABLE 1

| Symbol | Kind | Shape | Mean particle diameter (μm) |
|---|---|---|---|
| Cu-2 | copper powder | spherical | 2 |
| Cu-4 | " | dendritic | 4.3 |
| Cu-6* | " | " | 6 |
| Cu-8* | " | " | 8.2 |
| Cu-30 | " | " | 30 |
| Ni | nickel powder | spherical | 3 | note)
*copper powder treated with an organic compound

TABLE 2

| No. | | Molecular weight |
|---|---|---|
| | Polyhydroxystyrene derivative | |
| 1 | $+CH_2-CH+_n$ <br> ![phenol] OH | $\overline{Mn} = 1,300$ |
| 2 | " | $\overline{Mn} = 2,700$ |
| 3 | " | $\overline{Mn} = 4,800$ |
| 4 | " | $\overline{Mn} = 7,800$ |
| 5 | $+CH_2-CH+_n$ · <br> (Br)$_{1.3}$ OH | $\overline{Mn} = 3,000$ |
| | Comparative polymer | |
| 6 | $+CH_2-CH+_n$ <br> OH | $\overline{Mn} = 13,000$ |
| 7 | phenolic resin of resol type | $\overline{Mw} = 30,000$ |
| 8 | p-tert-butylphenolic resin | $\overline{Mw} = 30,000$ |
| 9 | n-butylated melamine resin | $\overline{Mw} = 600$ <br> degree of etherification: 10% |
| 10 | " | $\overline{Mw} = 70,000$ <br> degree of etherification: 40% |

TABLE 3

| Symbol | Compound | Weight-average molecular weight | Degree of etherification (%) |
|---|---|---|---|
| Thermo-setting resin | | | |
| A-1 | n-butylated melamine resin | 1,000 | 30 |
| A-2 | " | 2,200 | 15 |
| A-3 | " | 2,300 | 42 |
| A-4 | " | 4,000 | 40 |
| A-5 | " | 8,200 | " |
| A-6 | " | 24,000 | " |
| A-7 | " | 5,500 | 23 |
| A-8 | " | 6,000 | 40 |
| A-9 | " | 5,800 | 55 |
| A-10 | " | 6,600 | 80 |
| A-11 | " | 6,400 | 95 |
| B | iso-butylated melamine resin | 1,900 | 50 |
| C | methylated melamine resin (a product of Dainippon Ink & Chemicals, Inc.; L-105-60) | — | — |
| D | epoxy-modified melamine resin (a product of Mitsui Toatsu Chemicals, Inc.; Yuban 80S) | — | — |
| E | phenol-modified melamine resin | — | — |
| F | acrylic-modified melamine resin | — | — |
| G | polyester resin (a product of Mitsui Toatsu Chemicals, Inc.; Almatex P-645) | — | — |
| H | polyester polyol resin | — | — |
| I | polyurethane resin (a product of Dainippon Ink & Chemicals, Inc.; Barnok 16-411 | — | — |
| J | acrylic resin (a product of Mitsui Toatsu Chemicals, Inc.; Almatex E901) | — | — |
| K | phenolic resin of resol type (a product of Gunei Kagaku; PL-22-11) | — | — |
| L | urethane-modified epoxy resin | — | — |
| Other additive | | | |
| M | oleic acid | — | — |
| N | linoleic acid | — | — |
| O | palmitylamine | — | — |
| P | ricinoleic derivative of phenol | — | — |
| Q | linoleic derivative of phenol | — | — |
| R | linoleic derivative of methylphenol | — | — |
| S | hydroquinone | — | — |

TABLE 4

| | No. | conductive powder material symbol | amt. (pts.) | PVA(A) derivative[1] No. | binder (B) thermosetting resin / thermoplastic resin symbol | (A + B) (pts.) | $\left(\dfrac{A}{A+B}\times 100\right)$ % | additive symbol | additive amt. (pts.) | Volume resistivity (Ω·Cm) | Migration resistance | Flexibility | Printability |
|---|---|---|---|---|---|---|---|---|---|---|---|---|---|
| Invention | 1 | Cu-8 | 65 | 1 | A-4 | 30.6 | 25 | N | 4.4 | $9.2 \times 10^{-3}$ | B | ⊚ | ○ |
| | 2 | Cu-8 | 75 | " | " | 23.5 | " | " | 1.5 | $5.5 \times 10^{-3}$ | B | ⊚ | ○ |
| | 3 | Cu-8 | 80 | " | " | 17.5 | " | Q | 2.5 | $3.1 \times 10^{-4}$ | A | ⊚ | ○ |
| | 4 | Cu-8 | 85 | " | " | 13.2 | " | " | 1.8 | $3.5 \times 10^{-4}$ | A | ⊚ | ○ |
| | 5 | Cu-8 | 88 | " | " | 10.5 | " | " | 1.5 | $8.0 \times 10^{-3}$ | B | ⊚ | ○ |
| | 6 | Cu-2 | 83 | 2 | " | 14.9 | " | P | 2.1 | $3.1 \times 10^{-4}$ | A | ⊚ | ○ |
| | 7 | Cu-6 | " | " | " | " | 30 | Q | " | $1.5 \times 10^{-4}$ | A | ⊚ | ○ |
| | 8 | Cu-30 | " | " | " | " | " | R | " | $9.0 \times 10^{-3}$ | B | ⊚ | ○ |
| | 9 | Cu-8 | 85 | " | A-8 | 11.2 | 7 | Q | 3.8 | $4.0 \times 10^{-4}$ | A | ⊚ | ○ |
| | 10 | Cu-8 | " | " | " | " | 10 | " | " | $2.2 \times 10^{-4}$ | A | ⊚ | ○ |
| | 11 | Cu-8 | 80 | " | " | 15.0 | 20 | " | 5.0 | $1.5 \times 10^{-4}$ | A | ⊚ | ○ |
| | 12 | Cu-8 | " | " | " | " | 30 | " | " | $1.6 \times 10^{-4}$ | A | ⊚ | ○ |
| | 13 | Cu-8 | " | " | " | " | 70 | " | " | $2.5 \times 10^{-4}$ | A | ⊚ | ○ |
| | 14 | Cu-8 | 80 | 1 | A-4 | 15 | 35 | R | 5.0 | $1.8 \times 10^{-4}$ | A | ⊚ | ○ |
| | 15 | Cu-8 | " | 2 | A-4 | " | 30 | R | " | $1.3 \times 10^{-4}$ | A | ⊚ | ○ |
| | 16 | Cu-8 | " | 3 | " | " | " | " | " | $2.4 \times 10^{-4}$ | A | ⊚ | ○ |
| | 17 | Cu-8 | " | 4 | " | 14.4 | " | R + S | 5 + 0.6 | $6.2 \times 10^{-4}$ | B | ⊚ | △ |
| | 18 | Cu-8 | " | 5 | " | " | " | " | " | $9.1 \times 10^{-4}$ | A | ⊚ | ○ |
| | 19 | Cu-8 | " | 1 | A-1 | 15 | " | P | 5.0 | $5.5 \times 10^{-4}$ | A | ○ | ○ |
| | 20 | Cu-8 | " | " | A-2 | " | " | " | " | $2.1 \times 10^{-4}$ | A | ⊚ | ○ |
| | 21 | Cu-8 | " | " | A-3 | " | " | " | " | $3.6 \times 10^{-4}$ | A | ⊚ | ○ |
| | 22 | Cu-8 | " | " | A-4 | " | " | " | " | $2.1 \times 10^{-4}$ | A | ⊚ | ○ |
| | 23 | Cu-8 | " | " | A-5 | " | " | " | " | $3.4 \times 10^{-4}$ | A | ⊚ | ○ |
| | 24 | Cu-8 | 83 | " | A-6 | 12.8 | 50 | Q | 4.2 | $2.2 \times 10^{-4}$ | A | ⊚ | ○ |
| | 25 | Cu-8 | " | " | A-7 | " | " | " | " | $1.9 \times 10^{-4}$ | A | ⊚ | ○ |
| | 26 | Cu-8 | " | 2 | A-8 | " | " | " | " | $1.5 \times 10^{-4}$ | A | ⊚ | ○ |
| | 27 | Cu-8 | " | " | A-9 | " | " | " | " | $1.6 \times 10^{-4}$ | A | ⊚ | ○ |
| | 28 | Cu-8 | " | " | A-10 | " | " | " | " | $2.1 \times 10^{-4}$ | A | ⊚ | ○ |
| | 29 | Cu-8 | 83 | 2 | A-11 | 12.8 | 50 | Q | 4.2 | $4.4 \times 10^{-4}$ | A | ⊚ | ○ |
| | 30 | Cu-8 | " | " | B | 14.9 | 30 | R | 2.1 | $1.2 \times 10^{-4}$ | A | ⊚ | ○ |
| | 31 | Cu-8 | " | " | C | " | " | " | " | $5.2 \times 10^{-4}$ | A | ⊚ | ○ |
| | 32 | Cu-8 | " | " | D | " | " | " | " | $2.3 \times 10^{-4}$ | A | ⊚ | ○ |
| | 33 | Cu-8 | " | " | E | " | " | " | " | $2.1 \times 10^{-4}$ | A | ⊚ | ○ |
| | 34 | Cu-8 | " | " | F | " | " | " | " | $1.5 \times 10^{-4}$ | A | ⊚ | ○ |
| | 35 | Cu-8 | 80 | " | (A-3) + G | 12.2 + (3.5 + 1.8) | " | N | 2.5 | $4.3 \times 10^{-4}$ | A | ⊚ | ○ |
| | 36 | Cu-8 | " | " | (A-3) + H | " | " | " | " | $3.3 \times 10^{-4}$ | A | ⊚ | ○ |
| | 37 | Cu-8 | " | " | (A-3) + I | " | " | " | " | $8.1 \times 10^{-4}$ | A | ⊚ | ○ |
| | 38 | Cu-8 | " | " | (A-2) + J | " | " | " | " | $4.2 \times 10^{-4}$ | A | ⊚ | ○ |
| | 39 | Cu-8 | " | " | (A-2) + K | " | " | " | " | $2.3 \times 10^{-4}$ | A | ⊚ | ○ |
| | 40 | Cu-8 | " | " | (A-2) + L | " | " | " | " | $4.0 \times 10^{-4}$ | A | ⊚ | ○ |
| | 41 | Ni | " | " | A-4 | 15 | 30 | Q | 5.0 | $2.3 \times 10^{-4}$ | A | ⊚ | ○ |
| Comparative | 42 | Cu-8 | 35 | 2 | A-4 | 61 | " | Q | 4.0 | $2 \times 10^{-1}$ | C | ○ | ○ |
| | 43 | Cu-8 | 95 | " | " | 4.5 | 25 | M | 0.5 | $8 \times 10^{-2}$ | C | × | × |
| | 44 | Cu-8 | 70 | 6 | " | 28 | 0 | " | 2.0 | $6.5 \times 10^{-2}$ | C | △ | × |
| | 45 | Cu-8 | 80 | — | 7 | 15 | 0 | " | 5.0 | $5 \times 10^{-4}$ | C | △ | △ |
| | 46 | Cu-8 | " | — | (A-2) + 7 | 10.5 × 4.5 | " | " | " | $4.1 \times 10^{-4}$ | D | × | △ |

TABLE 4-continued

| No. | conductive powder material symbol | amt. (pts.) | PVA(A) derivative[1] No. | (B) thermosetting resin thermoplastic resin symbol | (A + B) (pts.) | $\left(\frac{A}{A+B} \times 100\right)$ % | additive symbol | amt. (pts.) | Volume resistivity ($\Omega \cdot Cm$) | Migration resistance | Flexibility | Printability |
|---|---|---|---|---|---|---|---|---|---|---|---|---|
| 47 | Cu-8 | " | — | 8 | 15 | 0 | " | " | $3.8 \times 10^{-4}$ | C | △ | o |
| 48 | Cu-8 | " | — | 9 | " | 40 | " | " | $2.0 \times 10^{-3}$ | C | △ | o |
| 49 | Cu-8 | " | " | 10 | " | " | " | " | $3.1 \times 10^{-2}$ | C | △ | o |
| 50 | Ni | 70 | — | (A − 2) + 7 | 17 + 8 | 0 | " | " | $8 \times 10^{-3}$ | C | △ | o | note
[1] polyhydroxystyrene derivative
[2] each amount is in terms of active ingredient Table 4 shows the characteristics of the conductive pastes of the present invention together with those of comparative pastes. It can be understood from the results given in Table 4 that pastes Nos. 1 to 40 according to the present invention each have a relatively excellent volume resistivity of the order of $10^{-2}$ to $10^{-4}$ $\Omega$.cm and are superior to comparative pastes Nos. 42 to 49 particularly in migration resistance and flexibility.

Further, it can be also understood that a conductive nickel paste No. 41 according to the present invention has migration resistance and flexibility more excellent than those of a comparative paste No. 50.

As described above, a conductive layer excellent in migration resistance and flexibility can be provided by using the conductive paste of the present invention.

We claim:

1. A conductive paste comprising an electrically conductive copper powder, an organic binder and a solvent as essential components, characterized in that said organic binder comprises a poly-p-hydroxystyrene represented by the following general formula (I) having a number-average molecular weight of at least 500 and up to 10,000; and a thermosetting resin selected from the group consisting of an amino resin and a phenolic resin, and that the amount of the conductive copper powder is 50% by weight to less than 90% by weight based on the total paste constituents excluding the solvent,

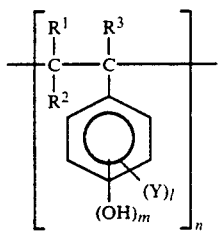

(I)

wherein n is a number of at least 3; m is a number satisfying the relationship; $0 < m \leq 2$, l is a number satisfying the relationship: $0 \leq l \leq 2$; Y is a halogen atom, and $R^1$ to $R^3$ are each a hydrogen atom or an alkyl group having 1 to 5 carbon atoms and wherein the weight ratio of said poly-p-hydroxystyrene to said thermosetting resin is in the range of between 5/95 to 95/5.

2. A conductive paste as set forth in claim 1, wherein said copper powder is a surface-treated electrolytic copper powder having a mean particle diameter of 10 μm or below.

3. A conductive paste as set forth in claims 1 or 2, wherein said thermosetting resin is at least one modified melamine resin selected from the group consisting of an alkyl-etherified melamine resins which are each prepared by the esterification of a melamine resin with a lower alcohol, and each have an average degree of etherification of 10 to 95% and a weight-average molecular weight of 500 to 50,000; epoxy-modified melamine resins, phenol-modified melamine resins, and acrylic-modified melamine resins each having a weight-average molecular weight of 500 to 50,000.

4. A conductive paste as set forth in claims 1 or 2, wherein said organic binder comprises
A) said polyhydroxystyrene derivative represented by the above general formula (I) having a number-average molecular weight of 500 or above but below 10,000;
B) said amino resin; and
C) at least one resin having a weight-average molecular weight of 500 to 50,000 selected from the group consisting of a polyester, a polyester polyol, a polyurethane, an acrylic resin, a phenolic resin and an epoxy resin, as a third component.

5. A conductive coating film prepared by the process of applying said conductive paste as set forth in claim 1 to a substrate; and curing said paste.

6. The conductive coating film prepared according to claim 5, wherein said applying is by coating.

7. The conductive coating film prepared according to claim 5, wherein said applying is by printing.

8. An electrically conductive paste composition comprising said electric conductive copper powder, said organic binder comprising (A) a poly-p-hydroxystyrene derivative as defined in claim 1 and (B) a thermosetting resin at a weight ratio of (A) to (B) in the range between 5/94 and 95/5 and a solvent, said powder being contained in an amount of 50 to 90 wt. % of the total composition except for the solvent.

9. The electrically conductive paste composition as claimed in claim 8, further comprising an alkyl or alkenyl phenol compound having the formula (II):

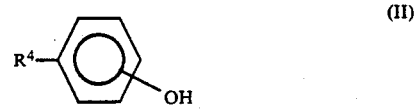

(II)

in which $R^4$ is a residue of an unsaturated fatty acid or an ester thereof, having 8 to 22 carbon atoms being attached to the ortho- or para-position of the phenol ring, or a residue having the formula (III): $R_5COOR_6$, in which $R_5$ is an alkyl or alkenyl group having 15 to 21 carbon atoms and $R_6$ is hydrogen, a hydroxyalkyl group having at least one carbon atom, a branched or straight-chain alkyl group or an aryl group.

10. The electrically conductive paste composition as claimed in claim 8, further comprising 0.1 to 20 parts by weight of an aliphatic phenol per 100 parts by weight of copper powder.

11. The electrically conductive paste composition as claimed in claim 8, further comprising 0.1 to 10 parts by weight of a higher aliphatic amine per 100 parts by weight of copper powder.

12. The electrically conductive paste composition as claimed in claim 8, further comprising 0.1 to 20 parts by weight of a reducing agent having an aromatic hydroxyl group per 100 parts by weight of copper powder.

13. The conductive paste of claim 1, wherein said phenolic resin is prepared by the addition and condensation of a phenolic hydroxyl-containing compound selected from the group consisting of phenol, cresol, xylenol, p-alkylphenol, chlorophenol, bisphenol A, phenolsulfonic acid and resorcinol; with an aldehyde selected from formalin and furfural.

14. The conductive paste of claim 1, wherein said phenolic resin is a resol resin.

15. The conductive paste of claim 1, wherein said phenolic resin is a novalak resin.

16. The conductive paste according to claim 15, further comprising hexamethylenetetramine.

17. The conductive paste according to claim 1, wherein said amino resin is an addition and condensation product of formaline with a compound selected from the group consisting of urea, melamine, guanamine, aniline, and sulfonamide.

18. The conductive paste according to claim 1, wherein said amino resin is selected from an epoxy-modified melamine resin, a phenol-modified melamine resin, an acrylic-modified melamine resin, a butylated urea resin, a butylated urea-melamine co-condensation resin, a butylated melamine-guanamine co-condensation resin, an amino-alkyl co-condensation resin and an alkyl-esterified melamine resin.

* * * * *